United States Patent
Knudsen

(10) Patent No.: US 6,188,347 B1
(45) Date of Patent: Feb. 13, 2001

(54) ANALOG-TO-DIGITAL CONVERSION SYSTEM AND METHOD WITH REDUCED SPARKLE CODES

(75) Inventor: Niels Knudsen, Humlebaek (DK)

(73) Assignee: National Instruments Corporation, Austin, TX (US)

(*) Notice: Under 35 U.S.C. 154(b), the term of this patent shall be extended for 0 days.

(21) Appl. No.: 09/351,758

(22) Filed: Jul. 12, 1999

(51) Int. Cl.7 .................................................. H03M 1/36
(52) U.S. Cl. .......................................... 341/159; 341/160
(58) Field of Search ........................... 341/94, 159, 160, 341/143; 708/210, 211, 212

(56) References Cited

U.S. PATENT DOCUMENTS

| | | | |
|---|---|---|---|
| 4,586,025 | * 4/1986 | Knierim | 340/347 DD |
| 4,712,087 | * 12/1987 | Traa | 340/347 CC |
| 5,029,305 | * 7/1991 | Richardson | 341/159 |
| 5,382,955 | * 1/1995 | Knierim | 341/160 |

OTHER PUBLICATIONS

Adams, "Design and Implementation of an Audio 18–Bit Analog–to–Digital Converter Using Oversampling Techniques," pp. 279–292, Reprinted from J. Audio Eng. Soc., vol. 34, pp. 153–166, Mar. 1986.

SPT7710, 8Bit, 150 MSPS, Flash A/D Converter, Signal Processing Technologies, Inc., Mar. 1997, pp. 1–12.

Chien, "High Speed, Low Power, Low Voltage Pipelines Analog–to–Digital Converter," MS Thesis, Univ. of California at Berkeley, Dept. of EE and CS, May 1996, Chapter 2 and App. A, pp. 4–17 and 44–47, (available as Technical Report Memo #M96/27 and at http://kubuki.eecs.berkeley.udu/~gchien/masters.html).

* cited by examiner

*Primary Examiner*—Howard L. Williams
(74) *Attorney, Agent, or Firm*—Conley, Rose & Tayon; Jeffrey C. Hood

(57) ABSTRACT

Analog-to-digital conversion with reduce sparkle codes. An analog-to-digital converter includes a plurality of comparators each coupled to receive an analog input signal, and an adder decoder coupled to receive the outputs of the comparators. Each comparator also receives a respective reference signal for comparison with the analog input signal. Each comparator outputs a digital value indicative of the comparison between the analog input signal and the respective reference signal. The adder decoder adds the digital output signals generated by the comparators and outputs a digital representation of the analog input signal based on the result. This system may advantageously provide for a more efficient way to convert analog signals to digital signals without the generation of sparkle codes. The adder decoder may be a pyramid of adders. A sigma-delta converter may include the comparators in the analog-to-digital portion in the feedback loop and the adder decoder outside of the feedback loop. The thermometer code is provided directly to the digital-to-analog converter of the sigma-delta converter and to the adder decoder.

11 Claims, 5 Drawing Sheets

ANALOG-TO-DIGITAL CONVERSION SYSTEM AND METHOD WITH REDUCED SPARKLE CODES

BACKGROUND OF THE INVENTION

1. Field of the Invention

This invention relates to analog-to-digital converters, and more particularly to a system and method for minimizing sparkle codes.

2. Description of the Related Art

Analog-to-digital conversion is used to interface an electrical or electronic system using analog signals capable of continuous variation to an electronic system using discrete digital signals. The reverse operation of digital-to-analog conversion is also used.

FIG. 1 illustrates an embodiment of a typical prior art parallel analog-to-digital converter (ADC) 100, also known as a flash converter. An analog input voltage signal (INPUT) 105 is input to a plurality of comparators 115. A reference voltage signal (REF) 110 is also input to the plurality of comparators 115 through a voltage divider tree including a plurality of resistors 111 between the reference signal 110 and ground 112. As shown, the positive input of each comparator 115 is the input signal 105, and the negative input of each comparator 115 is a reference signal between REF 110 and ground 112. The reference signal 110 applied to the negative input of each comparator 115 has a different voltage according to the voltage divider tree.

The output of each comparator 115 is typically input to a latch 120. The output of each comparator 115 is stored in the respective latch 120 upon a rising edge of the clock signal (CLK) 125. The collective outputs of the comparators 115, stored in the latches 120, are a thermometer code output 130. The thermometer code 130 is input to a decoder 135, sometimes referred to as an encoder. The decoder 135 decodes the thermometer code 130 into a multiple bit output 140. The output 140 is a digital value corresponding to the input analog signal 105.

A thermometer code 130 is typically a binary string of numbers, one binary value per comparator 115. Assigning the convention of most significant bit (MSB) on the left and least significant bit (LSB) on the right, i.e. MSB to LSB, the thermometer code 130 represents the binary output string of the plurality of comparators 115. The MSB is taken from the comparison between the input signal 105 and the reference signal 110. The LSB is taken from the comparison between the input signal 105 and the ground 112. In the thermometer code 130, each successive digit of the code changes from a "0" to a "1" as value of the thermometer code increases. Assuming seven comparators, the thermometer code and the decoded output 140 could only be any one of the following:

| Index | Thermometer Code | Decode |
|-------|------------------|--------|
| A | 0000000 | 000 |
| B | 0000001 | 001 |
| C | 0000011 | 010 |
| D | 0000111 | 011 |
| E | 0001111 | 100 |
| F | 0011111 | 101 |
| G | 0111111 | 110 |
| H | 1111111 | 111 |
|   | all other | unknown |

Note that thermometer code A signifies an input signal 105 that is below one-seventh of the reference signal 110. Thermometer code B signifies an input signal 105 that is above one-seventh of the reference signal 110 but below two-sevenths of the reference signal 110. Thermometer code H signifies an input signal 105 that is above the reference signal 110.

By convention, most ADCs 100 output the decode of thermometer code H as an error code since the output of the comparators 115 is other than an accepted value for a thermometer code 130. Any value above the reference signal 110 is unmeasurable, i.e. there is no way to know how far above the reference signal 110 that the input signal is. An output that is not a proper thermometer code 130 is called a sparkle code, glitch or glitch error, or a misconversion error. For example, if the output of the comparators 115 were 0001011, then the decoder 135 would output an unknown code.

The reason for the error code output is that decoders 135 typically only look for the single transition from a "0" to a "1" in the thermometer code 130. If two or more transitions occur, the decoder 135 cannot properly decode the thermometer code 130, and hence the decoder 135 may output an incorrect or erroneous code. Incorrect thermometer codes can result from signal propagation delays in the circuit. For example, the output of the comparators 115 may be latched by the latches 120 at slightly different times, allowing for one latch 120F to latch a "one" while latch 120G latches a "zero".

Therefore, an improved system and method for analog-to-digital conversion is desired that has reduced sparkle codes. The improved method of analog-to-digital conversion should have utility in many systems that use analog-to-digital conversion, such as sigma-delta (S/D) converters.

A sigma-delta converter 200, such as that shown in FIG. 2, may include an ADC 100 such as that shown in FIG. 1. Large numbers of error codes may cause problems in the multibit S/D converter 200 of FIG. 2. It is noted that these devices are also referred to as delta-sigma converters and oversampled ADCs. As shown, S/D) converter 200 accepts an input signal $V_{in}$ into a summing node 205. The output of the summing node 205 is filtered in a filter 210, preferably a low pass filter, before being presented to the ADC 100 of FIG. 1. The digital output 140 of the ADC 100 is the output of the sigma-delta converter 200. The digital output 140 is also fed into digital-to-analog (DAC) converter 220. The analog output of the DAC 220 is subtracted from the summing node 205. This creates a feedback loop inside the sigma-delta converter 200. It is noted that the addition or subtraction of the analog output of the DAC 220 in the summing node 205 is determined by the relative phase of the output of the comparators 115 in the ADC 100.

The S/D converter 200 converts the analog input signal $V_{in}$ into a continuous stream of digital signals at the output at a rate determined by the clock rate of the clock CLK 125, shown in FIG. 1. Due to the nature of the negative feedback loop, the average value outputted by the DAC 220 approaches that of the input signal $V_{in}$ if the loop gain is sufficiently high.

If a relatively rapidly changing analog signal is input to the S/D converter 200 as the analog input signal $V_{in}$, sparkle codes may generate a substantial amount of glitch energy, causing a loss of linearity. The bandwidth of the modulator also demands that the ADC 100 and DAC 220 take as little time as possible to process the analog-in and analog-out signals.

What is needed is an improved way to convert analog signals to digital signals in an analog-to-digital converter. The decode of the thermometer code 130 should be as close to the analog value as possible. Sigma-delta conversion should benefit from the low glitch energy of the improved ADC.

SUMMARY OF THE INVENTION

The present invention comprises a system and method for analog-to-digital conversion. The system comprises, in one embodiment, a plurality of comparators each coupled to receive an analog input signal, and an adder decoder coupled to receive the outputs of the comparators. Each comparator also receives a respective reference signal for comparison with the analog input signal. Each comparator is configured to output a digital value indicative of the comparison between the analog input signal and the respective reference signal. The adder decoder is configured to output a digital representation of the analog input signal based on the result and to add the digital output signals generated by the comparators. This system may advantageously provide for a more efficient way to convert analog signals to digital signals without the generation of sparkle codes.

In one embodiment, the adder decoder of the analog-to-digital comparator comprises a pyramid of adders. The first stage of the pyramid of adders may comprise 2-bit adders. Each additional stage of the pyramid of adders may comprise half as many n+1 bit adders as the n bit adders of the stage below. In one embodiment, the pyramid of adders is implemented in a programmable logic, preferably an FPGA.

Similarly, a method is also contemplated, comprising in one embodiment, first, receiving a thermometer code output from a plurality of comparators. If there are an odd number of comparators, an extra zero may be added. The method next counts the number of ones in the thermometer code. The number of zeros in the thermometer code may be interpreted as the decode of the thermometer code. The decode of the thermometer code is output as a digital representation of the input analog signal that lead to the thermometer code.

A sigma-delta converter is also contemplated including an analog-to-digital converter having the adder decoder of the present invention. The sigma-delta converter preferably includes an input summing junction configured to accept an analog input signal and a feedback signal, a loop filter coupled to the output of the summing junction, a plurality of comparators coupled to the output of the loop filter, and a digital-to-analog converter coupled to receive the output of the plurality of comparators, and to provide the feedback signal to the summing junction. An adder decoder is coupled to the output of the comparators outside the feedback loop. The thermometer code output from the comparators is provided to both the digital-to-analog converter and the adder decoder. The output of the sigma-delta converter is read from the adder decoder. The digital-to-analog converter included in the sigma-delta converter, in one embodiment, may make use of the lack of sparkle codes in the output of the plurality of comparators to output a low noise feedback signal to the summing junction. In addition, the digital-to-analog converter preferably receives the digital thermometer code directly from the plurality of comparators for reduced latency.

BRIEF DESCRIPTION OF THE DRAWINGS

Other objects and advantages of the invention will become apparent upon reading the following detailed description and upon reference to the accompanying drawings in which.

Figure 1:
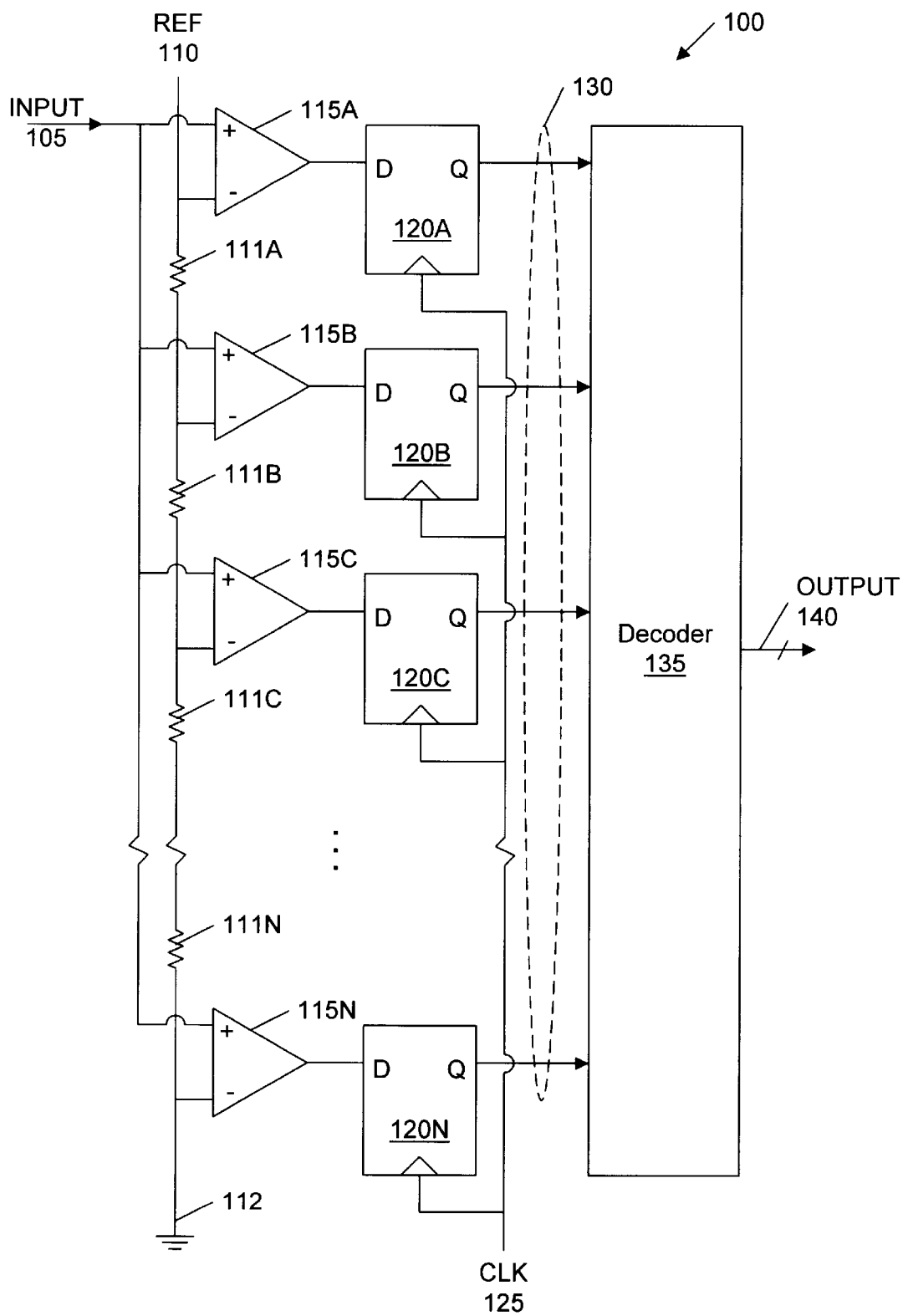
FIG. 1 is a block diagram of an embodiment of a prior art parallel analog-to-digital converter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
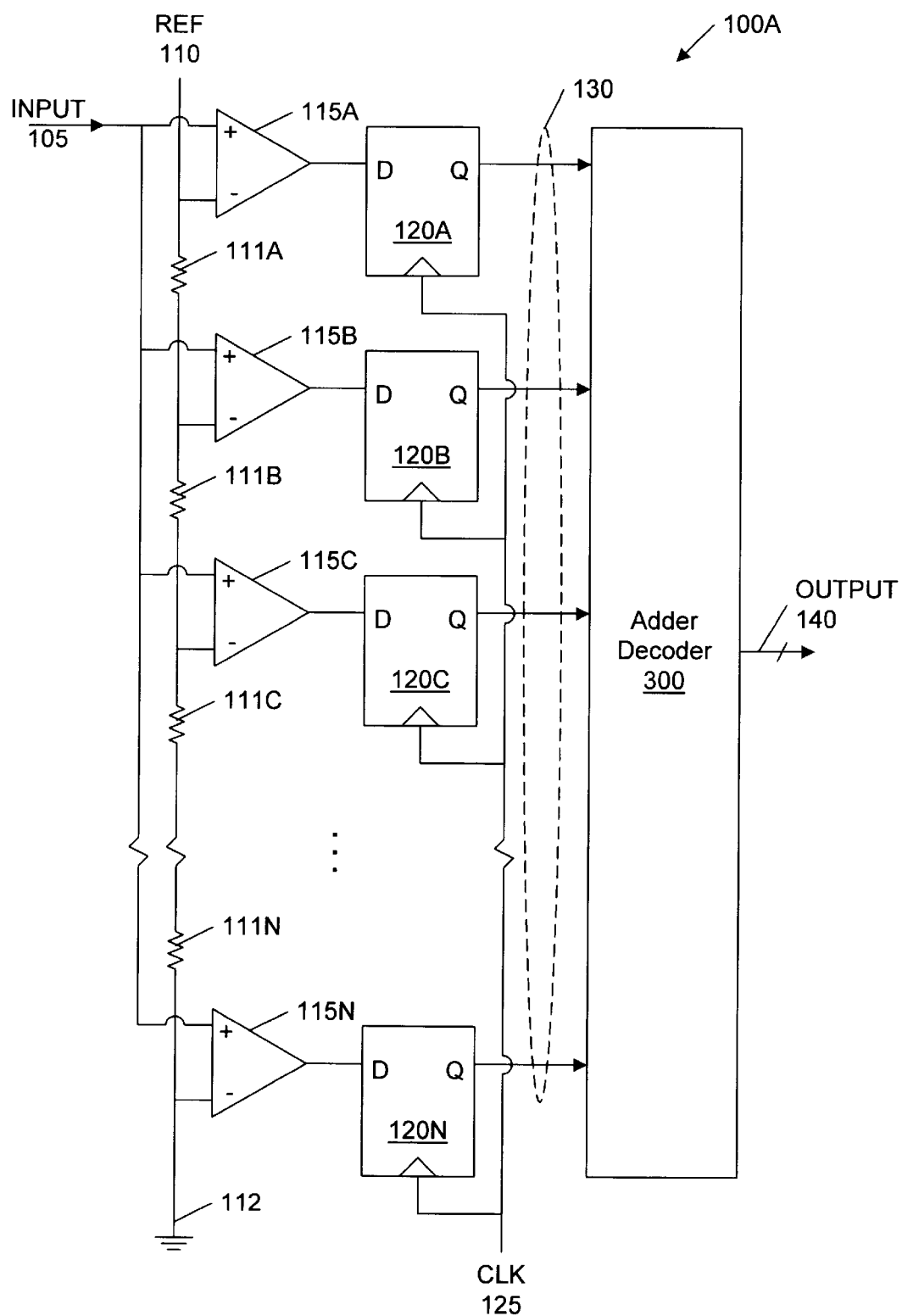
FIG. 3 is a block diagram of an embodiment of a parallel analog-to-digital converter including an adder decoder according to one aspect of the present invention.

FIG. 3 illustrates an embodiment of a parallel analog-to-digital converter (ADC) 100A, according to one aspect of the present invention. An analog input voltage signal (INPUT) 105 is input to a plurality of comparators 115. A reference voltage signal (REF) 110 is also input to the plurality of comparators 115 through a voltage divider tree. The voltage divider tree includes a plurality of resistors 111 between the reference signal 110 and ground 112. As shown, the positive input of each comparator 115 is the input signal 105, and the negative input of each comparator 115 is a reference signal between REF 110 and ground 112. The reference signal 110 applied to the negative input of each comparator 115 has a different voltage according to the voltage divider tree.

The output of each comparator 115 is typically input to a latch 120. The output of each comparator 115 is stored in the respective latch 120 upon a rising edge of the clock signal (CLK) 125. The collective outputs of the comparators 115, from the latches 120, are called a thermometer code output 130. The thermometer code 130 is input to an adder decoder 300, according to one aspect of the present invention. The adder decoder 300 decodes the thermometer code 130 into a multiple bit output 140 by adding the number of logical "ones" in the thermometer code. The multiple bit output 140 is a digital value corresponding to the input analog signal.

Figure 4:
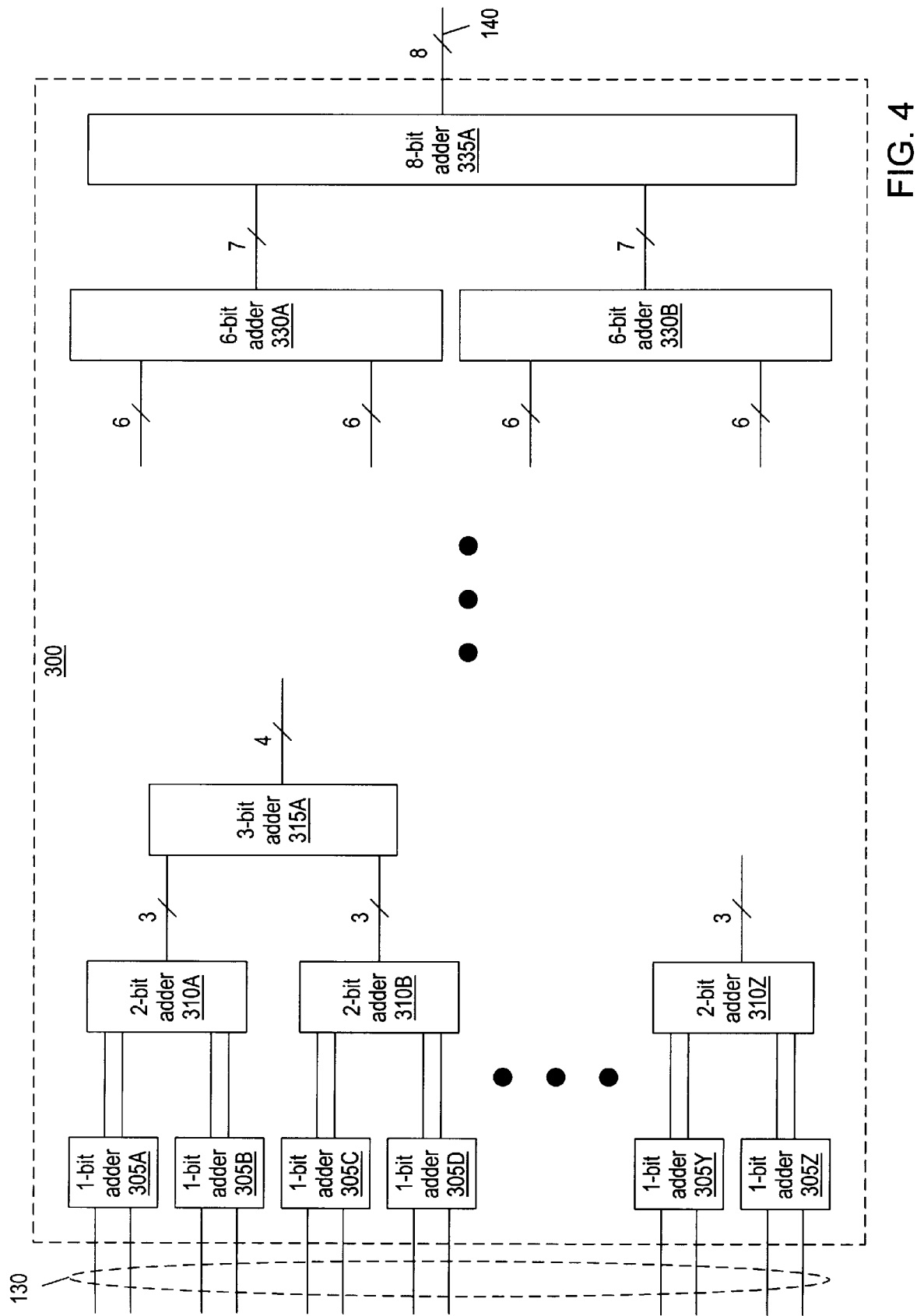
FIG. 4 is a block diagram of an embodiment of an adder decoder illustrated in FIG. 3.

FIG. 4 illustrates a block diagram of an embodiment of the adder decoder 300, shown in FIG. 3, according to one aspect of the present invention. Instead of reading the thermometer code 130 and converting, or decoding, to a multibit output as in the decoder 135 of FIG. 1, adder decoder 300 comprises a pyramid of adders that output the sum of the number of "1s" in the thermometer code 130. In cases of sparkle codes, the sum of the number of "1s" is still output, leading to a minimum amount of sparkle energy.

The adder decoder 300 may have various different configurations as desired, and FIG. 4 merely illustrates one example. As shown, a 255-bit thermometer code 130 is input into a plurality of 1-bit adders 305. Note that with only 255 inputs, a "0" is input for an additional bit needed to reach the next power of 2, in this case $2^8=256$. The 2-bit outputs of the 1-bit adders 305 are fed into half as many 2-bit adders 310.

The 3-bit outputs of the 2-bit adders 310 are again fed into half as many 3-bit adders 315. The pyramid shrinks until four 6-bit words are fed into two 6-bit adders 330A and 330B. The 7-bit outputs of the 6-bit adders 330 are then fed into a single 8-bit adder 335A. The 8-bit put of the 8-bit adder 335A is the 8-bit decode of the 255-bit thermometer code 130. The adders may be implemented in any form.

Another, simpler example of the pyramid of adders is a four stage pyramid that accepts a 15 or 16 bit thermometer code. A 15-bit thermometer code is transformed into a 16-bit thermometer code by adding an additional bit with a value of "zero". The first stage of the pyramid of adders includes 8 2-bit adders. Each 2-bit adder adds up two 1-bit values of the thermometer code. The outputs of the 2-bit adders are input into the second stage of the pyramid of adders, which includes 4 3-bit adders. Each 3-bit adder adds two 2-bit numbers and outputs a 3-bit number. The third stage of the pyramid of adders includes 2 4-bit adders that each add together two of the 3-bit numbers output by the 3-bit adders and output a 4-bit number. The fourth stage of the pyramid of adders includes a 5-bit adder that inputs the two 4-bit numbers from the third stage and is configured to output a 5-bit digital signal representative of the thermometer code. As mentioned above the number of stages and the number of adders in each stage may be varied as desired.

A preferred implementation of the adder decoder 300 is as programmable logic. The programmable logic may be of any desirable type of logic, such as programmable array logic (PAL), a programmable logic device (PLD), a field programmable gate array (FPGA), or any other dynamically reconfigurable logic (DRL) or dynamically reconfigurable hardware (DRH), as these terms are known in the art. It is noted that the programmable logic may be comprised of a logic type which is reconfigurable only once, as well as logic which can be reconfigured multiple times. It may be desirable to prevent future reconfiguration. Another preferred implementation of the adder decoder 300 uses a fast hardware pipeline.

With adder decoder 300 substituted in ADC 100A for the prior art decoder 135 of the ADC 100 of FIG. 1, the ADC 100A may advantageously convert analog signals into digital signals with fewer or no sparkle code outputs. Thus, the output 140 should vary smoothly even when the input signal 105 varies rapidly. It is noted that the present invention may provide for a symmetric error distribution that may be unattainable in the prior art. In the prior art, a sparkle code results in a digital output that is uncorrelated with the analog input signal. As shown above, an output of all "1s" is typical of the output resulting from a sparkle code.

According to one aspect of the present invention, a sparkle code results in a digital output that is normally either one above or one below the expected digital output. Thus, the present invention may allow for a symmetric error distribution that is centered on the digital representation of the analog input signal. As the probability of a sparkle code that is two above or two below the expected digital output is lower and equal, the error distribution may be seen to approach a normal distribution about the expected value.

Figure 2:
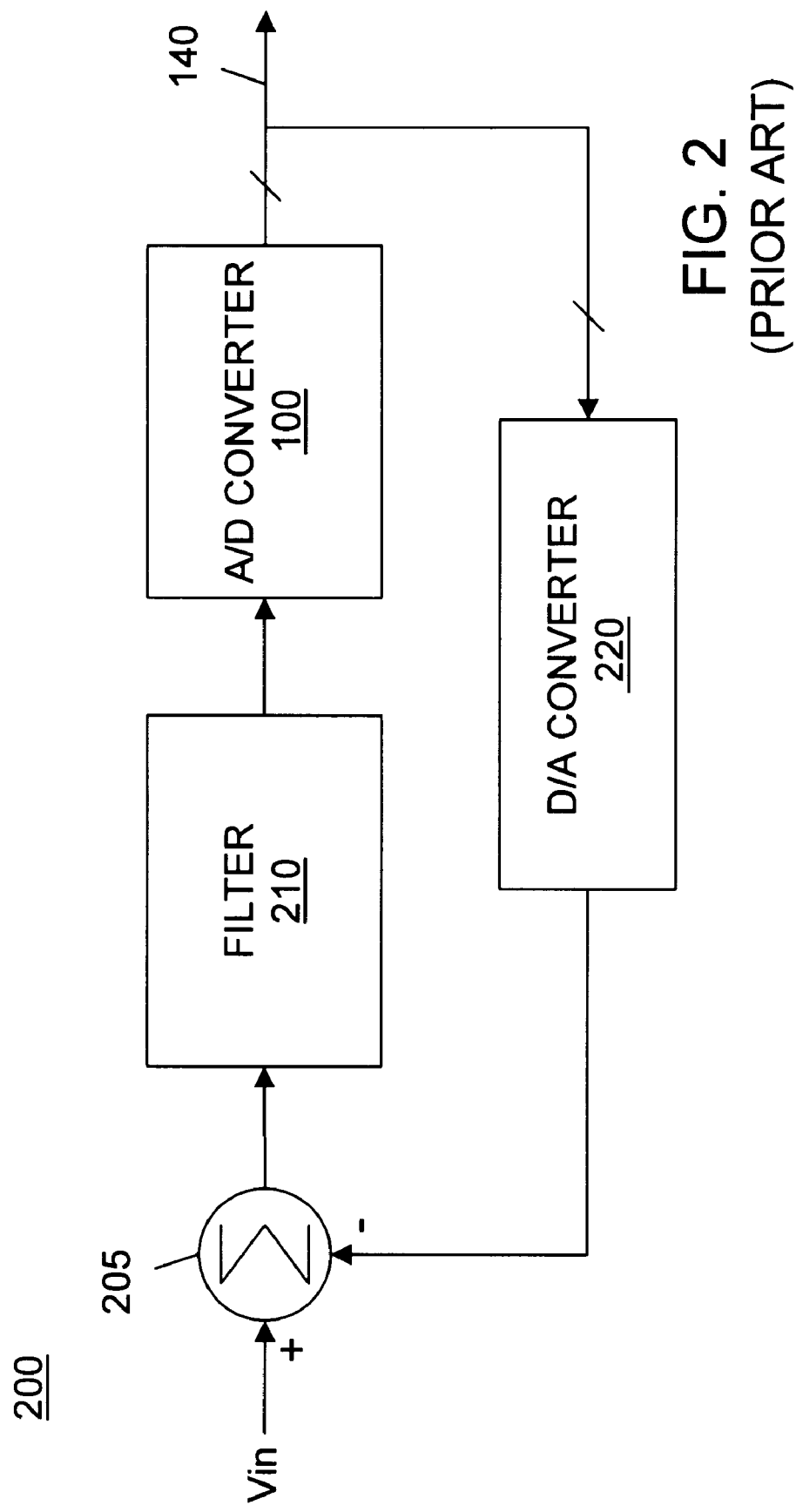
FIG. 2 is a block diagram of an embodiment of a prior art sigma-delta converter that includes a parallel analog-to-digital converter similar to that shown in FIG. 1.

In one embodiment, the ADC 100A of the present invention may replace the ADC 100 in the S/D converter of FIG. 2.

Figure 5:
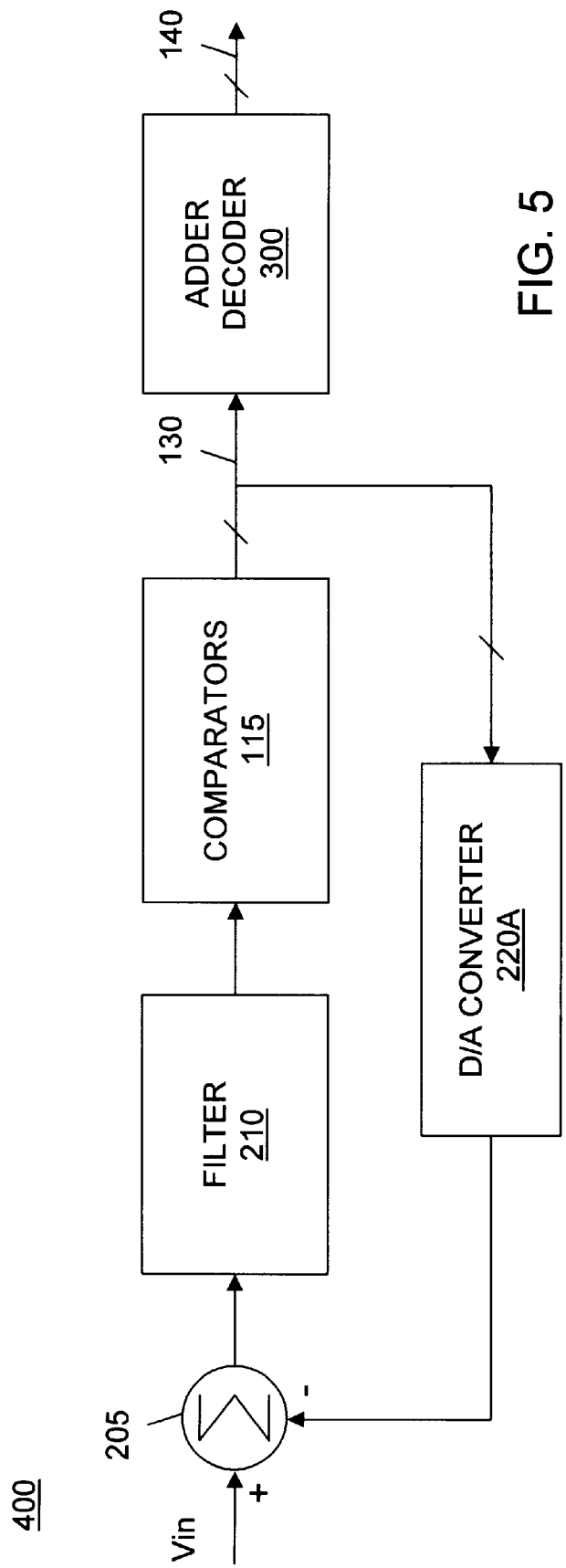
FIG. 5 is a block diagram of an embodiment of a sigma-delta converter including the adder decoder illustrated in FIG. 3, according to another aspect of the present invention.

FIG. 5 illustrates another aspect of the present invention, wherein comparators 115 and the adder decoder 300 comprise a portion of a multibit D/S converter 400, thereby providing improved linearity. FIG. 5 illustrates the comparators 115 comprised in the feedback loop, and the added decoder 300 coupled out of the feedback loop. Thus, the thermometer code 130 is input into the DAC 220A directly. DAC 220A preferably comprises an adder for summing the 1's of the thermometer code. The thermometer code 130 is also input into the decoder 300 directly. The decoder 300 also comprises an adder for summing the 1's of the thermometer code. The same thermometer code 130 is provided to both the adder decoder 300 and the DAC 220A. The adder decoder 300 thus decodes the same thermometer code 130 input to the DAC 220A to produce the output signal 140. In other words, the DAC 220A and the decoder 300 receive the same thermometer code and decode it in the same way, i.e., the decode is performed by adding up logical ones. Thus, in the event of a sparkle code, the DAC 220A and the decoder 300 handle the error in the same way, and the error is suppressed due to the loop gain factor.

It is noted that the internals of the DAC 220A differ from the internals of the DAC 220 of FIG. 2. For example, the DAC 220A may simply comprise current generators and D/A summers, such as summing D/A resistors. Each of the current generators preferably receives a respective bit of the output thermometer code. In a preferred embodiment, shown in FIG. 5, the DAC 220A includes one current generator for each bit in the code to minimize glitch energy in the signal and overcome timing limitations that plague the use of fewer, weighted current generators. Thus, the S/D converter 400 of FIG. 5 may have reduced latency by avoiding redundant A/D and D/A operations, while reducing the amount of glitch energy inside the feedback loop.

It can be shown that the total conversion quality depends more on the DAC 220 or 220A than on the ADC 100 or 100A. Likewise, the DAC 220A and the decoder 300 should process the information in the same way. Thus, the adder decoder 300 of the present invention avoids sparkle codes and allows for processing of a uniform signal by both the DAC 220A and the decoder 300.

Numerous variations and modifications will become apparent to those skilled in the art once the above disclosure is fully appreciated. It is intended that the following claims be interpreted to embrace all such variations and modifications.

What is claimed is:

1. An analog-to-digital converter, comprising:
    a plurality of comparators each coupled to receive an analog input signal, wherein each comparator is further coupled to receive a respective reference signal for comparison with the analog input signal, wherein the plurality of comparators are each further configured to output a digital value indicative of the comparison of the analog input signal with the respective reference signal; and
    an adder decoder coupled to receive the outputs of the plurality of comparators, wherein the adder decoder is configured to add the digital values output by the plurality of comparators, wherein the adder decoder is further configured to output a digital signal representative of the analog input signal based on a result of adding the digital values output by the plurality of comparators;
    wherein the adder decoder comprises programmable logic configured to add the digital values output by the plurality of comparators.

2. The analog-to-digital converter of claim 1, wherein the number of comparators is $2^N-1$, where N is the number of bits output by the analog-to-digital converter.

3. The analog-to-digital converter of claim 1, wherein the digital value indicative of the comparison of the analog input signal with the respective reference signal is a digital zero unless the analog input signal is greater than or equal to the respective reference signal in which case a digital one is output.

4. The analog-to-digital converter of claim 1, wherein the adder decoder is configured to add the outputs of the plurality of comparators together arithmetically to produce the output.

5. The analog-to-digital converter of claim 4, wherein the adder decoder includes a pyramid of adders, wherein a first stage of the pyramid includes 2-bit adders, with each additional stage including adders with an additional bit, until a last stage includes 2 adders configured to output a digital signal representative of the analog input signal.

6. The analog-to-digital converter of claim 5, wherein the plurality of comparators includes at least 15 comparators, wherein the first stage of the pyramid of adders includes at least 8 2-bit adders, wherein a second stage of the pyramid of adders includes at least 4 3-bit adders, wherein a third stage of the pyramid of adders includes at least 2 4-bit adders, and wherein the fourth stage of the pyramid of adders includes at least 1 5-bit adder configured to output at least a 5 bit digital signal representative of the analog input signal.

7. The analog-to-digital converter of claim 1, further comprising:
   a plurality of latches coupled between the plurality of comparators and the adder decoder.

8. The analog-to-digital converter of claim 1, wherein errors due to sparkle codes are symmetrically distributed.

9. A sigma-delta converter, comprising:
   a summing node coupled to receive an analog input signal and an analog feedback signal and to output a combined analog signal;
   a loop filter coupled to receive said combined analog signal, wherein the loop filter is configured to output a filtered analog signal;
   a plurality of comparators each coupled to receive the filtered analog signal, wherein each comparator is further coupled to receive a respective reference signal for comparison with the filtered analog signal, wherein the plurality of comparators are further configured to output a thermometer code value indicative of the comparison of the filtered analog signal with the respective reference signal; and
   a digital-to-analog converter coupled to receive the thermometer code values indicative of the comparison of the filtered analog signal with the respective reference signals output by the plurality of comparators, wherein the digital-to-analog converter is configured to output said analog feedback signal based on the thermometer code values; and
   an adder decoder coupled to receive the thermometer code values, wherein the adder decoder is configured to add the digital values output by the plurality of comparators, wherein the adder decoder is further configured to output a digital signal representative of the input signal;
   wherein the adder decoder comprises programmable logic configured to add the digital values output by the plurality of comparators.

10. The sigma-delta converter of claim 9, further comprising:
    a plurality of latches coupled between the plurality of comparators and the adder decoder.

11. The sigma-delta converter of claim 9, wherein the digital-to-analog converter includes a current generator for each of a plurality of bits in the thermometer code, wherein each current generator is coupled to receive a respective bit of the thermometer code.

* * * * *